(12) United States Patent
Tsuchiya et al.

(10) Patent No.: US 7,826,180 B2
(45) Date of Patent: Nov. 2, 2010

(54) MAGNETO-RESISTIVE EFFECT DEVICE OF THE CPP STRUCTURE, AND MAGNETIC DISK SYSTEM

(75) Inventors: Yoshihiro Tsuchiya, Tokyo (JP); Tomohito Mizuno, Tokyo (JP); Shinji Hara, Tokyo (JP)

(73) Assignee: TDK Corporation, Tokyo (JP)

( * ) Notice: Subject to any disclaimer, the term of this patent is extended or adjusted under 35 U.S.C. 154(b) by 752 days.

(21) Appl. No.: 11/768,435

(22) Filed: Jun. 26, 2007

(65) Prior Publication Data

US 2009/0002893 A1 Jan. 1, 2009

(51) Int. Cl.
G11B 5/39 (2006.01)

(52) U.S. Cl. .................................... 360/324.1
(58) Field of Classification Search ............... 360/324.1
See application file for complete search history.

(56) References Cited

U.S. PATENT DOCUMENTS

| | | | | |
|---|---|---|---|---|
| 7,046,489 B2 * | 5/2006 | Kamiguchi et al. | ...... | 360/324.1 |
| 7,672,080 B1 * | 3/2010 | Tang et al. | ............ | 360/125.12 |
| 7,672,085 B2 * | 3/2010 | Hara et al. | .................. | 360/324 |
| 2003/0047728 A1 * | 3/2003 | Chen | ........................... | 257/10 |
| 2007/0188945 A1 * | 8/2007 | Fuji et al. | ............. | 360/324.12 |
| 2008/0112096 A1 * | 5/2008 | Mizuno et al. | ......... | 360/324.12 |
| 2008/0174920 A1 * | 7/2008 | Hara et al. | ............... | 360/294.1 |
| 2008/0204942 A1 * | 8/2008 | Machita et al. | .......... | 360/324.1 |
| 2009/0086383 A1 * | 4/2009 | Hara et al. | .................. | 360/324 |
| 2009/0174971 A1 * | 7/2009 | Tsuchiya et al. | ......... | 360/324.2 |
| 2009/0296283 A1 * | 12/2009 | Mizuno et al. | .............. | 360/319 |
| 2010/0124617 A1 * | 5/2010 | Matsuzawa et al. | ......... | 427/470 |

FOREIGN PATENT DOCUMENTS

| | | |
|---|---|---|
| JP | 2003-8102 | 1/2003 |
| JP | 2003-298143 | 10/2003 |
| JP | 2009010333 A * | 1/2009 |

OTHER PUBLICATIONS

Harikumar et al, "An investigation of the Cu/ZnO/Zn system: evidence for the formation of Cu/Zn alloys by the inward diffusion of Cu", Applied Surface Science 93 (1996) 135-141.*
U.S. Appl. No. 11/934,979, filed Nov. 5, 2007, Mizuno, et al.
U.S. Appl. No. 12/112,598, filed Apr. 30, 2008, Hara et al.
U.S. Appl. No. 12/128,352, filed May 28, 2008, Mizuno, et al.
U.S. Appl. No. 11/762,457, filed Jun. 13, 2007, Mizuno, et al.
U.S. Appl. No. 11/757,174, filed Jun. 1, 2007, Tsuchiya, et al.
U.S. Appl. No. 11/626,562, filed Jan. 24, 2007, Hara, et al.
U.S. Appl. No. 11/865,384, filed Oct. 1, 2007, Hara, et al.
U.S. Appl. No. 11/943,171, filed Nov. 20, 2007, Hara, et al.
U.S. Appl. No. 11/968,911, filed Jan. 3, 2008, Tsuchiya, et al.

* cited by examiner

*Primary Examiner*—Julie Anne Watko
(74) *Attorney, Agent, or Firm*—Oblon, Spivak, McClelland, Maier & Neustadt, L.L.P.

(57) ABSTRACT

The invention provides a giant magneto-resistive effect device (CPP-GMR device) having a CPP (current perpendicular to plane) structure comprising a spacer layer, and a fixed magnetized layer and a free layer stacked one upon another with said spacer layer interposed between them, with a sense current applied in a stacking direction, wherein the free layer functions such that the direction of magnetization changes depending on an external magnetic field, and the spacer layer comprises a first and a second nonmagnetic metal layer, each formed of a nonmagnetic metal material, and a semiconductor oxide layer interposed between the first and the second nonmagnetic metal layer, wherein the semiconductor oxide layer that forms a part of the spacer layer is made of zinc oxide, tin oxide, indium oxide, and indium tin oxide (ITO), the first nonmagnetic metal layer is made of Cu, and the second nonmagnetic metal layer is substantially made of Zn. MR change rate and heat resistance are thus much more improved than ever before.

11 Claims, 5 Drawing Sheets

MAGNETO-RESISTIVE EFFECT DEVICE OF THE CPP STRUCTURE, AND MAGNETIC DISK SYSTEM

BACKGROUND OF THE INVENTION

1. Field of the Invention

The present invention relates to a magneto-resistive effect device of the CPP structure for reading the magnetic field strength of a magnetic recording medium or the like as signals, a thin-film magnetic head comprising that magneto-resistive effective device, and a head gimbal assembly and a magnetic disk system comprising that thin-film magnetic head.

2. Explanation of the Prior Art

With recent improvements in the plane recording density of magnetic disk systems, there has been growing demands for improvements in the performance of thin-film magnetic heads. For the thin-film magnetic head, a composite type thin-film magnetic head has been widely used, which has a structure wherein a reproducing head having a read-only magneto-resistive effect device (hereinafter often referred to as the MR (magneto-resistive) device for short) and a recording head having a write-only induction type magnetic device are stacked together on a substrate.

For the MR device, there is the mention of an AMR device harnessing an anisotropic magneto-resistive effect, a GMR device harnessing a giant magneto-resistive effect, a TMR device harnessing a tunnel-type magneto-resistive effect, and so on.

The reproducing head is required to have high sensitivity and high outputs in particular. GMR heads using a spin valve type GMR device have already been mass-produced as a reproducing head possessing such performances, and to meet further improvements in plane recording densities, reproducing heads using TMR devices are now being mass-produced, too.

In general, the spin valve type GMR device comprises a nonmagnetic layer, a free layer formed on one surface of that nonmagnetic layer, a fixed magnetization layer formed on another surface of the nonmagnetic layer, and a pinned layer (generally an antiferromagnetic layer) on the side of the fixed magnetization layer facing away from the non-magnetic layer. The free layer has its magnetization direction changing depending on a signal magnetic field from outside, and the fixed magnetization layer has its magnetization direction fixed by a magnetic field from the pinned layer (antiferromagnetic layer).

Incidentally, common GMR heads used so far in the art have a CIP (current in plane) structure wherein a current for detecting magnetic signals (the so-called sense current) is passed parallel with the plane of each of the layers forming the GMR device (CIP-GMR device). On the other hand, GMR devices having the so-called CPP (current perpendicular to plane) structure wherein the sense current is passed perpendicularly to the plane of each of the layers forming the GMR device (CPP-GMR device), too, are now under development as the next-generation ones.

The aforesaid TMR devices, too, would come under the CPP structure category according to a classification system from the current-passing direction alone. However, the multilayer construction and detection principle of the TMR device are different from those of the CPP-GMR device. That is, the TMR device generally comprises a free layer, a fixed magnetization layer, a tunnel barrier layer located between them, and an antiferromagnetic layer located on the plane of the fixed magnetized layer that faces away from its plane in contact with the tunnel barrier layer. The tunnel barrier layer is a nonmagnetic insulating layer through which electrons can pass in a state with spins reserved by the tunnel effect. The rest of the multilayer structure, i.e., the free layer, fixed magnetization layer and antiferromagnetic layer could be basically identical with those used with the spin valve type GMR device.

It is here noted that when the TMR device is used for a reproducing head, it is required to have low resistance for the following reasons. For a magnetic disk system, there is a demand for improved recording density and improved data transfer rate and with that, the reproducing head is required to have good high-frequency response. However, as the resistance value of the TMR device grows large, it will cause an increase in stray capacitances occurring at the TMR device and a circuit connected to it, rendering the high-frequency response of the reproducing head worse. This is the reason the TMR device must inevitably have low resistance.

Generally speaking, reducing the thickness of the tunnel barrier layer would work for making the resistance of the TMR device low. However, too thin a tunnel barrier layer would cause a lot more pinholes to occur in the tunnel barrier layer, rendering the service life of the TMR device short. Further, there would be a magnetic couple produced between the free layer and the fixed magnetization layer, ending up with problems: a lot more noise and a drop of MR ratio leading to degradation of TMR device's performance. The noise occurring at the reproducing head is here called head noise. The head noise occurring at the reproducing head using the TMR device includes shot noise—a noise component that is unlikely to occur at a reproducing head using the GMR device. Thus, a problem with the reproducing head using the TMR device is that the head noise is noticeable.

With the CPP-GMR device, on the other hand, there is a problem that no large enough MR ratio is obtained. A possible reason for it could be that spin-polarized electrons are scattered at the interface between the nonmagnetic electroconductive layer and the magnetic layer and in the nonmagnetic electroconductive layer, resulting in losses of spin information.

Also, the CPP-GMR device, because of having a small resistance value, is low in terms of the amount of resistance change. For this reason, in order to obtain large reproduction output with the CPP-GMR device, high voltage must be applied to that device. However, the application of high voltage to the device offers such problems as described below. With the CPP-GMR device, currents are passed in a direction perpendicular to the plane of each layer, whereupon spin-polarized electrons are poured from the free layer into the fixed magnetization layer or from the fixed magnetization layer into the free layer. Such spin-polarized electrons cause torque (hereinafter called the spin torque) that rotates those magnetizations to be generated at the free layer or the fixed magnetization layer. The magnitude of this spin torque is proportional to a current density. As the voltage applied to the CPP-GMR device grows high, it causes the current density to grow large with the result that there is large spin torque. As the spin torque increases, there are problems such as changes in the direction of magnetization of the fixed magnetization layer, and the inability of the free layer to freely change the direction of magnetization with respect to an external magnetic field.

To solve such problems, Applicant has already filed Japanese Patent Application No. 2006-275972 to come up with an invention relating to a CPP-GMR device, with which large MR ratios are achieved while noise is held back and the influence of the spin torque is staved off. That is, in a preferable embodiment of that invention, a spacer layer interposed between the free layer and the fixed magnetization layer has typically a Cu/ZnO/Cu multilayer structure, and the area resistivity (AR) of a magneto-resistive effect device and the electroconductivity of the spacer layer are determined in such a way as to fall within the given ranges.

By allowing the spacer layer to have typically a three-layer structure of Cu/ZnO/Cu according to this proposal, large MR ratios are achievable while holding back noise and staving off the influence of the spin torque.

The present invention is an invention for making further improvements in or relating to Japanese Patent Application No. 2006-275972, and embodied as follows.

More specifically, with such recording densities as exceeding a next-generation 1 Tbpsi in mind, there is much left to be desired in the MR change rate; the main object of the invention is to provide a novel magneto-resistive effect device that surpasses the arrangement of No. 2006-275972 at least in terms of MR change ratios. Another object is to make further improvements in heat resistance. In other words, the specific object of the invention is to eliminate problems with heat resistance known to be caused by the fact that heat treatment added after device formation gives rise to a drop of the MR change ratio or a change in the area resistivity, AR, of the magneto-resistive effect device.

Note here that the prior art that seems to be most relevant to the invention of this application is JP-A-2003-8102. This prior art sets forth a CPP-GMR device comprising a fixed magnetization layer having a fixed magnetization direction, a free magnetization layer with its magnetization direction changing depending on an external magnetic field, a nonmagnetic metal intermediate layer interposed between the fixed magnetization layer and the free magnetization layer, and a resistance control layer interposed between the fixed magnetization layer and the free magnetization layer and formed of a material having conduction carriers of up to $10^{22}/cm^3$. The prior art shows a semiconductor as one of resistance control layer materials; however, it does not suggest at all about the requirements for the invention of this application.

SUMMARY OF THE INVENTION

As mentioned above, the invention of this application concerns an improvement in or relating to Japanese Patent Application No. 2006-275972 already filed by Applicant according to the purports as briefed above.

Specifically, the invention provides a magneto-resistive effect device having a CPP (current perpendicular to plane) structure comprising a spacer layer, and two magnetic layers stacked one upon another with said spacer layer interposed between them, with a sense current applied in a stacking direction, wherein said spacer layer comprises a first nonmagnetic metal layer and a second nonmagnetic metal layer, each formed of a nonmagnetic metal material, and a semiconductor oxide layer interposed between the first nonmagnetic metal layer and the second nonmagnetic metal layer, wherein the semiconductor oxide layer that forms a part of said spacer layer is made of at least one selected from the group consisting of zinc oxide, tin oxide, indium oxide, and indium tin oxide (ITO), said first nonmagnetic metal layer is made of Cu, and said second nonmagnetic metal layer is substantially made of Zn.

According to a preferable embodiment of the invention, the invention provides a magneto-resistive effect device (CPP-GMR device) having a CPP (current perpendicular to plane) structure, wherein the aforesaid two magnetic layers are a fixed magnetization layer and a free layer, with a sensing current applied in a stacking direction thereof, wherein said free layer functions such that the direction of magnetization changes depending on an external magnetic field.

In a preferable embodiment of the invention, said spacer layer is located such that said first nonmagnetic metal layer is in contact with said fixed magnetization layer, and said second nonmagnetic metal layer is in contact with said free layer.

In a preferable embodiment of the invention, said spacer layer is located such that said first nonmagnetic metal layer is in contact with said free layer, and said second nonmagnetic metal layer is in contact with said fixed magnetization layer.

In a preferable embodiment of the invention, said first nonmagnetic metal layer has a thickness of 0.1 to 1.2 nm, said second nonmagnetic layer has a thickness of 0.1 to 1.2 nm, and said semiconductor oxide layer forming a part of said spacer layer has a thickness of 1.0 to 4.0 nm.

In a preferable embodiment of the invention, said second nonmagnetic metal layer is made of a single layer of Zn, an alloy layer of Zn and Ga, or a multilayer of Zn and GaO.

In a preferable embodiment of the invention, the magneto-resistive effect device has an area resistivity of 0.1 to $3\Omega \cdot \mu m^2$.

In a preferable embodiment of the invention, said spacer layer has an electroconductivity of 133 to 432 (S/cm).

The invention also provides a thin-film magnetic head, which comprises a plane opposite to a recoding medium, the aforesaid magneto-resistive effect device that is located near said medium opposite plane for detecting a signal magnetic field from said recording medium, and a pair of electrodes for passing a current in the stacking direction of said magneto-resistive effect device.

Further, the invention provides a head gimbal assembly, which comprises a slider including the aforesaid thin-film magnetic head and located in opposition to a recording medium, and a suspension adapted to resiliently support said slider.

Still further, the invention provides a magnetic disk system, which comprises a slider including the aforesaid thin-film magnetic head and located in opposition to a recording medium, and a positioning means adapted to support and position said slider with respect to said recording medium.

EXPLANATION OF THE PREFERRED EMBODIMENTS

The best mode for carrying out the invention is now explained in details.

Figure 1:
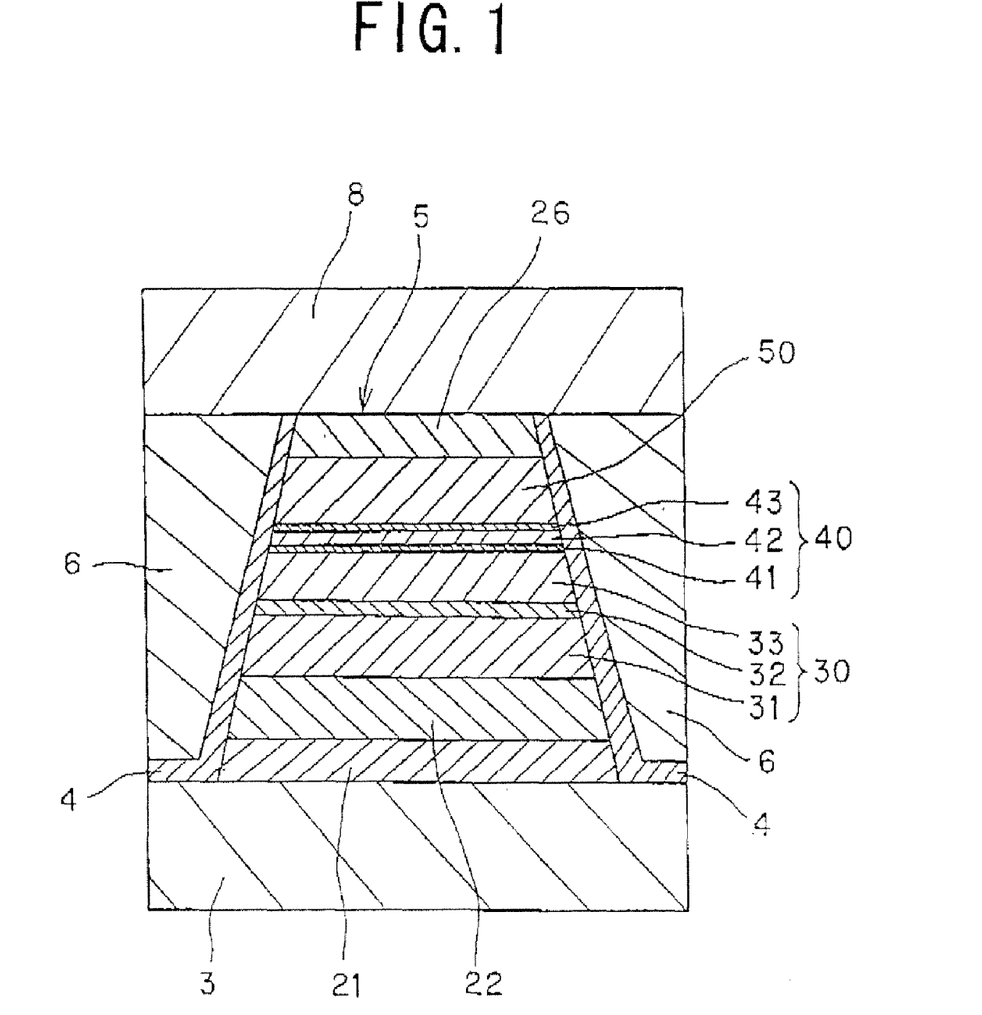
FIG. 1 is a sectional view illustrative of a section of the reproducing head primarily parallel with the medium opposite plane in an embodiment of the invention.

FIG. 1 is illustrative of the ABS (air bearing surface) of the reproducing head in an embodiment of the invention; it is illustrative in schematic of the ABS of the giant magneto-resistive effect device (CPP-GMR device) having a CPP structure—part of the invention in particular. An ABS is generally corresponding to a plane (hereinafter often called the medium opposite plane) at which a reproducing head is in opposition to a recording medium; however, it is understood that the ABS here includes even a section at a position where the multilayer structure of the device can be clearly observed. For instance, a protective layer such as DLC (the protective layer adapted to cover the device), in a strict sense, positioned at the medium opposite plane may be factored out, if necessary.

Figure 2:
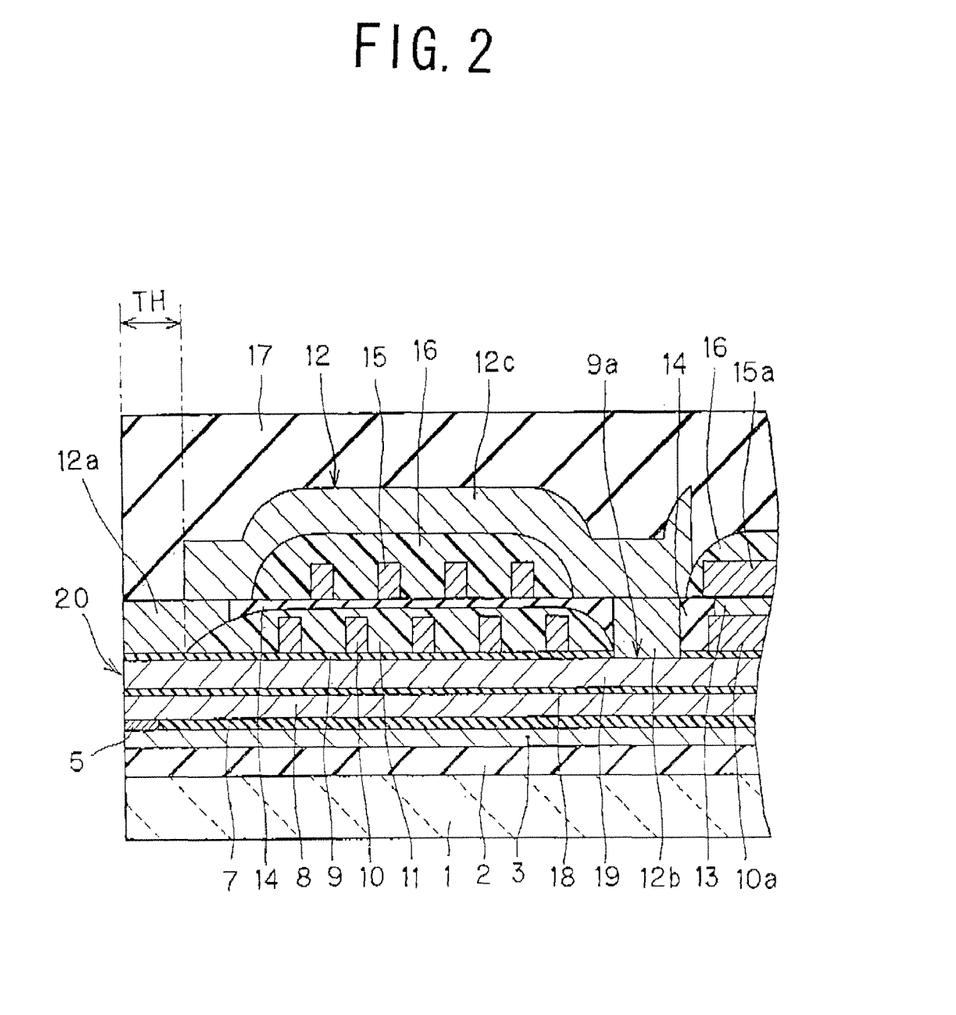
FIG. 2 is illustrative of the construction of the thin-film magnetic head according to one preferable embodiment of the invention; it is a sectional view illustrative of the thin-film magnetic head perpendicular to the medium opposite plane and the substrate.

FIG. 2 is illustrative of the construction of the thin-film magnetic head according to one preferable embodiment of the invention; it is a sectional view illustrative of a section of the thin-film magnetic head perpendicular to the ABS and the substrate.

Figure 3:
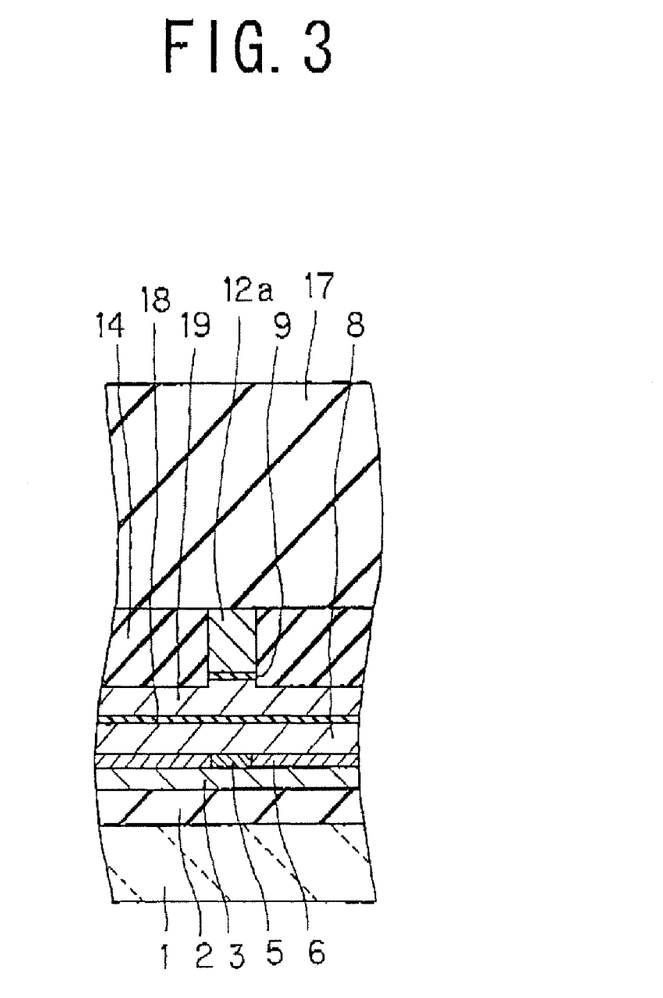
FIG. 3 is illustrative of the construction of the thin-film magnetic head according to one preferable embodiment of the invention; it is a sectional view illustrative of a section of a magnetic pole portion of the thin-film magnetic head parallel with the medium opposite plane.

FIG. 3 is illustrative of the construction of the thin-film magnetic head according to one preferable embodiment of the invention; it is a sectional view illustrative of a section of a magnetic pole portion of the thin-film magnetic head parallel with the ABS in particular.

Figure 4:
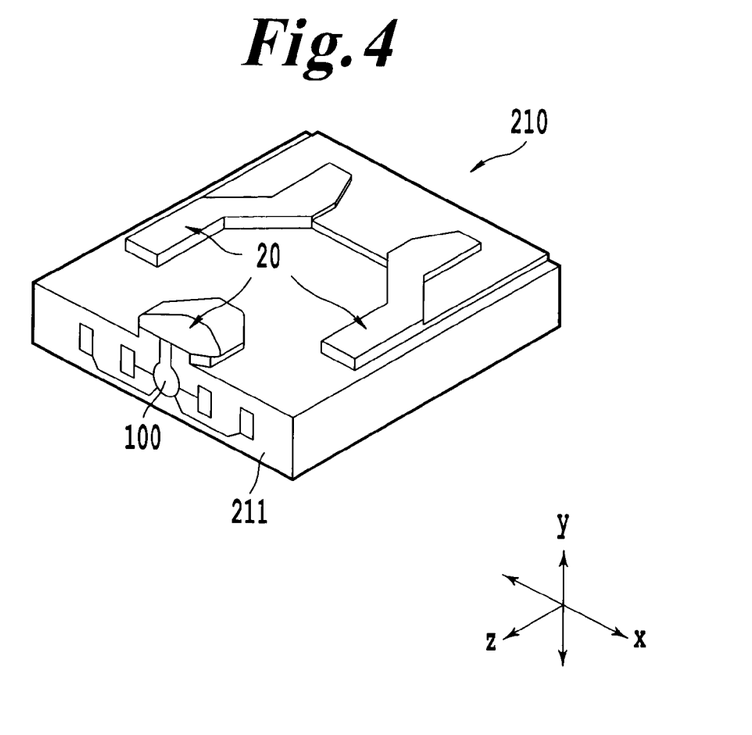
FIG. 4 is a perspective view of a slider built in the head gimbal assembly according to one embodiment of the invention.
Figure 5:
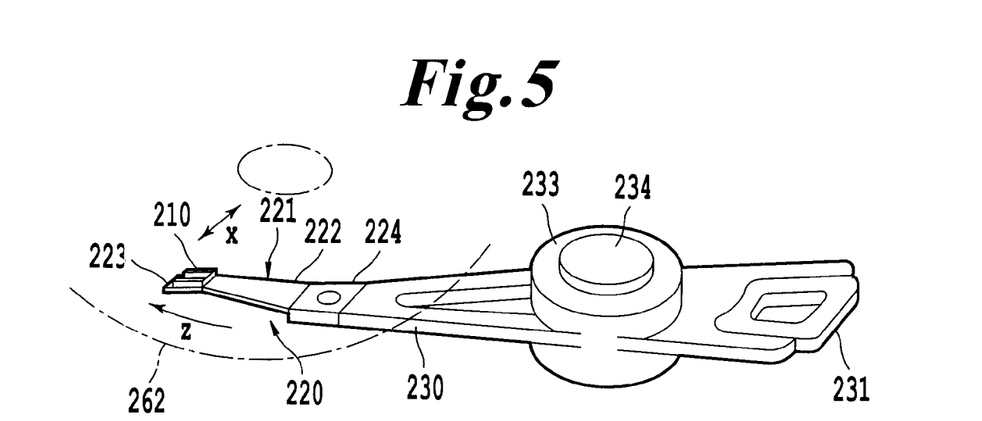
FIG. 5 is a perspective view of a head arm assembly including the head gimbal assembly according to one embodiment of the invention.
Figure 6:
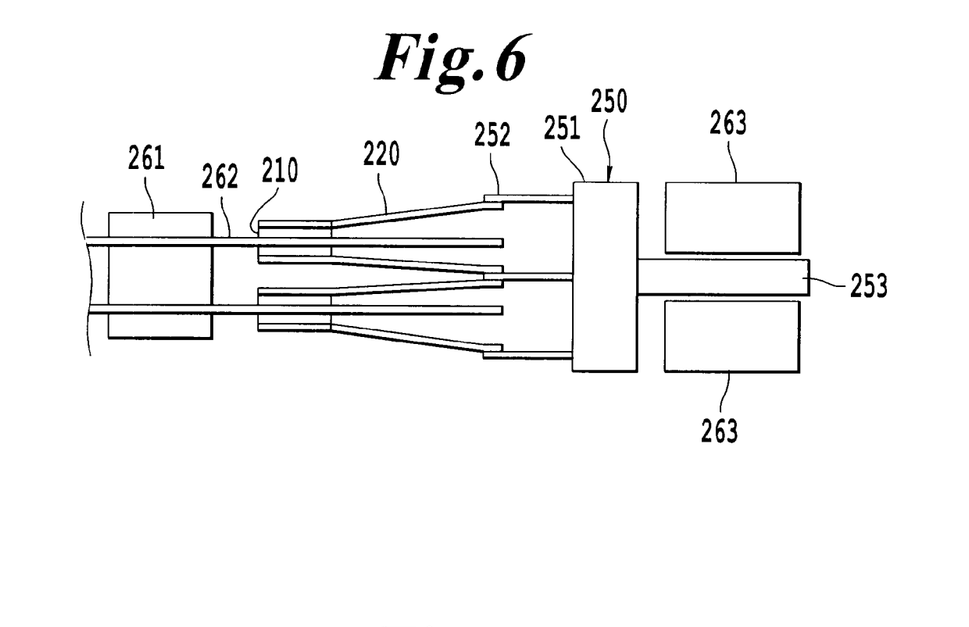
FIG. 6 is illustrative of part of the magnetic disk system according to one embodiment of the invention.
Figure 7:
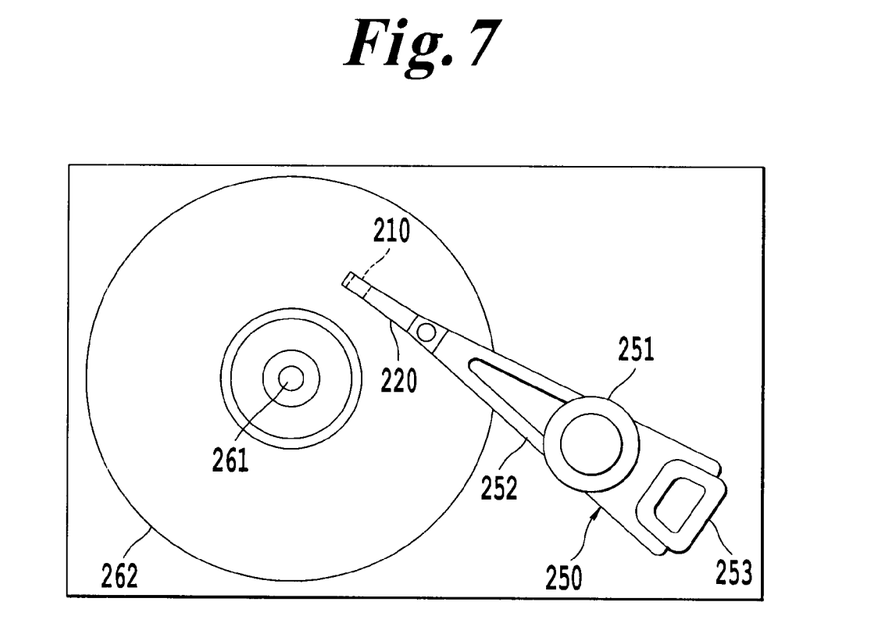
FIG. 7 is a plan view of the magnetic disk system according to one embodiment of the invention.

FIG. 4 is a perspective view of a slider built in the head gimbal assembly according to one embodiment of the invention; FIG. 5 is a perspective view of a head arm assembly including the head gimbal assembly according to one embodiment of the invention; FIG. 6 is illustrative of part of the magnetic disk system according to one embodiment of the invention; and FIG. 7 is a plan view of the magnetic disk system according to one embodiment of the invention.

[Giant Magneto-Resistive Effect Device (CPP-GMR Device) of the CPP Structure]

The construction of a reproducing head comprising the inventive giant magneto-resistive effect device (CPP-GMR device) of the CPP structure is now explained in details with reference to FIG. 1.

As noted above, FIG. 1 is a sectional view corresponding to a section of the reproducing head parallel with the medium opposite plane.

As shown in FIG. 1, the reproducing head according to the embodiment here comprises a first shield layer 3 and a second shield layer 8 that are located at a given space and opposed vertically on the sheet, a giant magneto-resistive effect device 5 (hereinafter referred to as the GMR device 5) interposed between the first shield layer 3 and the second shield layer 8, an insulating film 4 adapted to cover two sides of the GMR device 5 and a part of the upper surface of the first shield layer 3 along these sides, and two bias magnetic field-applying layers 6 adjacent to the two sides of the GMR device 5 via the insulating layer 4.

In the embodiment here, the first 3 and the second shield layer 8 take a so-called magnetic shield role plus a pair-of-electrodes role. In other words, they have not only a function of shielding magnetism but also function as a pair of electrodes adapted to pass a sense current through the GMR device in a direction intersecting the plane of each of the layers forming the GMR device 5, for instance, in a direction perpendicular to the plane of each of the layers forming the GMR device (stacking direction).

Apart from the first 3 and the second shield layer 8, another pair of electrodes may be additionally provided above and below the GMR device.

The reproducing head of the invention includes the GMR device 5 of the CPP structure—part of the invention.

Referring to the inventive GMR device 5 having a CPP structure in terms of a broad, easy-to-understand concept, it comprises a spacer layer 40, and a fixed magnetization layer 30 and a free layer 50 that are stacked one upon another with the spacer layer 40 held between them, as shown in FIG. 1. And then, a sense current is applied to the GMR device 5 in its stacking direction to enable its function. In short, there is the GMR device 5 of the CPP (current perpendicular to plane) structure involved.

The free layer 50 has its magnetization direction changing dependent on an external magnetic field, viz., a signal magnetic field from a recording medium, while the fixed magnetization layer 30 has its magnetization direction fixed under the action of an antiferromagnetic layer 22. While an embodiment with the antiferromagnetic layer 22 formed on a bottom side (the side of the first shield layer 3) is shown in FIG. 1, it is contemplated that the antiferromagnetic layer 22 may be formed on a top side (the side of the second shield layer 8) to interchange the free layer 50 and the fixed magnetization layer 30 in position.

(Explanation of the Fixed Magnetization Layer 30)

In the invention, the fixed magnetization layer 30 is formed on the antiferromagnetic layer 22 having a pinning action via an underlay layer 21 formed on the first shield layer 3.

In a preferable embodiment of the invention, the fixed magnetization layer 30 has a so-called synthetic pinned layer comprising, in order from the side of the antiferromagnetic layer 22, an outer layer 31, a non-magnetic intermediate layer 32 and an inner layer 33, all stacked together in order.

The outer layer 31, and the inner layer 33 is provided by a ferromagnetic layer made of, for instance, a ferromagnetic material containing Co, and Fe. The outer 31 and the inner layer 32 are antiferromagnetically coupled and fixed such that their magnetization directions are opposite to each other.

The outer 31, and the inner layer 33 is preferably made of, for instance, a $CO_{65-70}Fe$ (atomic %) alloy. The outer layer has a thickness of preferably about 2 to 7 nm, and the inner layer 33 has a thickness of preferably about 2 to 10 nm. The inner layer 33 may also contain a Heusler alloy layer.

For instance, the nonmagnetic intermediate layer 32 is made of a nonmagnetic material containing at least one selected from the group consisting of Ru, Rh, Ir, Re, Cr, Zr and Cu, and has a thickness of, for instance, about 0.35 to 1.0 nm. The nonmagnetic intermediate layer 32 is provided to fix the magnetization of the inner layer 33 and the magnetization of the outer layer 31 in mutually opposite directions. The phrase "magnetization in mutually opposite directions" stands for a broad concept that encompasses just only two such magnetizations in just opposite directions of 180 but also those in different directions of 180°±20° as well.

(Explanation of the Free Layer 50)

The free layer 50 has its magnetization direction changing depending on an external magnetic field, i.e., a signal magnetic field from the recording medium, and is made of a ferromagnetic layer (soft magnetic layer) having a small coercive force. The free layer 50 has a thickness of, for instance, about 2 to 10 nm, and may be in either a single layer form or a multilayer form including a plurality of ferromagnetic layers. The free layer 50 may also contain a Heusler alloy layer.

On such free layer 50, there is a protective layer 26 formed, which comprises a Ta or Ru layer as an example, as shown in FIG. 1. The protective layer 26 has a thickness of about 0.5 to 20 nm.

(Explanation of the Spacer Layer 40)

In the invention, the spacer layer 40 is made of a first nonmagnetic metal layer 41 and a second nonmagnetic metal layer 43, and a semiconductor oxide layer 42 interposed between these first and second nonmagnetic metal layers 41 and 43.

More specifically, the spacer layer 40 is made of a three-layer structure comprising the first nonmagnetic metal layer 41/semiconductor oxide layer 42/the second nonmagnetic metal layer 43 stacked together in order. In the embodiment here, the first nonmagnetic metal layer 41 is positioned on the side of the fixed magnetization layer 30, while the second nonmagnetic metal layer 43 is positioned on the side of the free layer 50, as depicted in FIG. 1. These layers are each explained in more details.

Semiconductor Oxide Layer 42

The semiconductor oxide layer 42 that forms a part of the spacer layer 40 here is made of at least one selected from the group consisting of zinc oxide, tin oxide, indium oxide, and indium tin oxide (ITO), as described just below.

(1) Embodiment where the Semiconductor Oxide Layer 42 is Made of Zinc Oxide (ZnO)

The semiconductor oxide layer 42 that forms a part of the spacer layer 40 has its main component composed of zinc oxide (ZnO). A layer of zinc oxide (ZnO) in film form, for instance, may be formed by a sputtering film-formation technique using ZnO as a target. The layer may as well be formed by sputtering followed by oxidization.

Such a thin film is usually heat treated at 200 to 350° C. for 1 to 10 hours after film formation. This is to crystallize the ZnO layer, thereby making the resistance of the film low. The phrase "after film-formation" includes both after the film formation for the semiconductor oxide layer and after the film formation for the whole device. Usually, the heat treatment is carried out after the film formation for the whole device.

(2) Embodiment where the Semiconductor Oxide Layer 42 is made of Indium Oxide ($In_2O_3$)

The semiconductor oxide layer that forms a part of the aforesaid spacer layer is made of indium oxide ($In_2O_3$). An indium oxide layer, for instance, may be formed by a sputtering film-formation technique using an indium oxide ($In_2O_3$) target.

Such a thin film is usually heat treated at 200 to 350° C. for 1 to 10 hours after film-formation for the purpose of crystallizing the indium oxide ($In_2O_3$) layer to make its resistance low. The phrase "after film-formation" includes both after the film formation for the semiconductor oxide layer and after the film formation for the whole device. Usually, the heat treatment is carried out after the film formation for the whole device.

(3) Embodiment where the Semiconductor Oxide Layer 42 is Made of Tin Oxide ($SnO_2$)

The semiconductor oxide layer that forms a part of the aforesaid spacer layer is made of tin oxide ($SnO_2$).

A tin oxide layer, for instance, may be formed by a sputtering film-formation technique using a tin oxide ($SnO_2$) target.

Such a thin film is usually heat treated at 200 to 350% for 1 to 10 hours after film-formation for the purpose of crystallizing the tin oxide ($SnO_2$) layer to make its resistance low. The phrase 'after film-formation' includes both after the film formation for the semiconductor oxide layer and after the film formation for the whole device. Usually, the heat treatment is carried out after the film formation for the whole device.

(4) Embodiment where the Semiconductor Oxide Layer 42 is Made of Indium Tin Oxide (ITO)

Indium tin oxide (ITO) is a compound wherein a few % of tin oxide ($SnO_2$) are added to indium oxide ($In_2O_3$). The content of tin oxide ($SnO_2$) is 0.1 to 20.0 mol %, and preferably 0.3 to 10.0 mol %. For ITO film formation, for instance, a $SnO_2$ chip is pasted to an indium oxide ($In_2O_3$) target to prepare a composite target, followed by sputtering. Alternatively, a given amount of $SnO_2$ may be mixed with indium oxide ($In_2O_3$), and the resultant mixture is then subjected to ordinary sputtering using a fired target. Yet alternatively, an indium oxide ($In_2O_3$) target and a tin oxide ($SnO_2$) target may be co-discharged into a film.

Such a thin film is usually heat treated at 200 to 350° C. for 1 to 10 hours after film-formation for the purpose of crystallizing the indium tin oxide (ITO) layer to make its resistance low. The phrase "after film-formation" includes both after the film formation for the semiconductor oxide layer and after the film formation for the whole device. Usually, the heat treatment is carried out after the film formation for the whole device.

Each of the aforesaid semiconductor oxide layers 42 may be used at a thickness of 1.0 to 4.0 nm, preferably 1.2 to 2.8 nm. A thickness of less than 1.0 nm will tend to cause inconvenience: large variations of device performance inclusive of device area resistivity AR. A thickness of greater than 4.0 nm, on the other hand, will tend to cause inconvenience: a worsening of MR performance by the scattering of spins. There will be another inconvenience: a deviation of the CPP-GMR device from the range of resistance that it should have.

The First 41, and the Second Nonmagnetic Metal Layer 43

In the invention, the first nonmagnetic metal layer 41 is made of Cu.

In the invention, the second nonmagnetic metal layer 43 is preferably made of Zn. Alternatively, the second nonmagnetic metal layer 43 may be made of an alloy layer of Zn and Ga or a multilayer of Zn and GaO. In the present disclosure, wherever the second nonmagnetic metal layer 43 is described as being "substantially made of Zn" is understood to include every embodiment from (1) the embodiment wherein the second nonmagnetic metal layer 43 is made of Zn to (2) the embodiment wherein it is made of an alloy layer of Zn and Ga to (3) the embodiment wherein it is made of a multilayer of Zn and GaO.

In the embodiment shown in FIG. 1, the spacer layer 40 is located between the free layer 50 and the fixed magnetization layer 30 in such a way that the first non-magnetic metal layer 41 is in contact with the fixed magnetization layer 30 and the second nonmagnetic metal layer 43 is in contact with the free layer 50. Alternatively, the spacer layer 40 shown in FIG. 1 may be flipped over (viz., the spacer layer 40 may be turned upside down in FIG. 1) in such a way as to bring the first nonmagnetic metal layer 41 in contact with the free layer 50 and the second nonmagnetic metal layer 43 in contact with the fixed magnetization layer 30. In other words, the essential requirement for the invention is that the first nonmagnetic metal layer 41 be in contact with one magnetic layer (fixed magnetization layer 30 or free layer 50), and the second nonmagnetic metal layer 43 be in contact with another magnetic layer (free layer 50 or fixed magnetization layer 30).

The first nonmagnetic metal layer 41 should have a thickness of 0.1 to 1.2 nm, preferably 0.3 to 1.0 nm, and the second nonmagnetic metal layer 43 should have a thickness 0.1 to 1.2 nm, preferably 0.3 to 1.0 nm.

The electroconductivity of the spacer layer 40 constructed as described above is desirously in the range of 133 to 432 S/cm. The electroconductivity of the spacer layer 40 here is defined as the reciprocal of the resistivity ($\Omega \cdot cm$) of the spacer layer 40.

(Explanation of the Antiferromagnetic Layer 22)

The antiferromagnetic layer 22 works such that by way of exchange coupling with the fixed magnetization layer 30 as described above, the magnetization direction of the fixed magnetization layer 30 is fixed.

For instance, the antiferromagnetic layer 22 is made of an antiferromagnetic material containing at least one element M' selected from the group of Pt, Ru, Rh, Pd, Ni, Cu, Ir, Cr and Fe, and Mn. The content of Mn is preferably 35 to 95 at %. The antiferromagnetic material is broken down into two types: (1) a non-heat treatment type antiferromagnetic material that shows anti-ferromagnetism even in the absence of heat treatment to induce an exchange coupling magnetic field between it and a ferromagnetic material, and (2) a heat treatment type antiferromagnetic material that is going to show anti-ferromagnetism by heat treatment. To the anti-ferromagnetic material of the type (1), too, heat treatment is usually applied to place the direction of exchange coupling in order. In the invention, both types (1) and (2) may be used without restriction. For instance, the non-heat treatment type antiferromagnetic material is exemplified by RuRhMn, FeMn, and IrMn, and the heat treatment type antiferromagnetic material is exemplified by PtMn, NiMn, and PtRhMn.

The antiferromagnetic layer 22 has a thickness of about 4 to 30 nm.

It is here noted that for the layer for fixing the magnetization direction of the fixed magnetization layer 30, it is acceptable to use a hard magnetic layer comprising a hard magnetic material such as CoPt in place of the aforesaid antiferromagnetic layer.

The underlay layer 21 formed below the anti-ferromagnetic layer 22 is provided to improve the crystallization and orientation of each of the layers stacked on it in general, and the exchange coupling of the antiferromagnetic layer 22 and the fixed magnetization layer 30 in particular. For such underlay layer 21, for instance, a multilayer of Ta and NiCr layers or Ta and Ru layers is used. The underlay layer 21 has a thickness of about 2 to 6 nm as an example.

The area resistivity, AR, of the magneto-resistive effect device 5 (CPP-GMR device 5) here is in the range of 0.1 to $0.3 \Omega \cdot \mu m^2$, preferably 0.12 to $0.3 \Omega \cdot \mu m^2$, and more preferably 0.14 to $0.28 \Omega \cdot \mu m^2$. Any deviation from the range of 0.1 to $0.3 \Omega \cdot \mu m^2$ would make it difficult to obtain large MR ratios while reducing noises and staving off the influences of spin torque.

The device (CPP-GMR device) to be measured for its area resistivity is a multilayer arrangement comprising the underlay layer 21, antiferromagnetic layer 22, fixed magnetization layer 30, spacer layer 40, free layer 50 and protective layer 26, as shown in FIG. 1.

Referring now to the insulating layer 4 shown in FIG. 1, it is made of typically an alumina material. For the bias magnetic field-applying layer 6, for instance, use is made of a hard magnetic layer (hard magnet) or a multilayer arrangement of a ferromagnetic layer and an antiferromagnetic layer, specifically, CoPt, and CoCrPt.

The giant magneto-resistive effect device (CPP-GMR device) of the CPP structure in the embodiment of the invention as described above may be formed by means of vacuum film-formation techniques such as sputtering. If required, heat treatment may be applied to it after film-formation.

(Explanation of the Whole Construction of the Thin-Film Magnetic Head)

The whole construction of the thin-film magnetic head comprising the aforesaid magneto-resistive effect device is now explained. As already mentioned, FIGS. 2 and 3 are illustrative of the construction of the thin-film magnetic head according to one preferred embodiment of the invention; FIG. 2 is illustrative of a section of the thin-film magnetic head perpendicular to the ABS and a substrate, and FIG. 3 is illustrative of a section of a magnetic pole portion of the thin-film magnetic head parallel with the ABS.

The whole structure of the thin-film magnetic head will be better understood when consideration is given to its fabrication process steps; the whole structure of the thin-film magnetic head is now explained with reference to its fabrication process steps.

First of all, an insulating layer 2 comprising an insulating material such as alumina ($Al_2O_3$) or silicon dioxide ($SiO_2$) is formed by sputtering or like techniques on a substrate 1 comprising a ceramic material such as AlTiC ($Al_2O_3$—TiC). That insulating layer has a thickness of about 0.2 to 20 µm as an example.

Then, a lower shield layer 3 comprising a magnetic material and adapted for a reproducing head is formed on that insulating layer 2. The shield layer 3 has a thickness of about 0.1 to 5 µm as an example. The magnetic material used for such lower shield layer 3, for instance, includes FeAlSi, NiFe, CoFe, CoFeNi, FeN, FeZrN, FeTaN, CoZrNb, and CoZrTa. The lower shield layer 3 is formed by sputtering, plating or like other techniques.

Then, a reproducing CPP-GMR device 5 is formed on the lower shield layer 3.

Although not shown, an insulating film is then formed in such a way as to cover two sides of the MR device and the upper surface of the first shield layer 3. The insulating film is formed of an insulating material such as alumina.

Then, two bias magnetic field-applying layers 6 are formed in such a way as to be adjacent to the two sides of the MR device 5 via the insulating layer. Then, an insulating film 7 is formed in such a way as to be located around the CPP-GMR device 5 and bias magnetic field-applying layers 6. The insulating film 7 is formed of an insulating material such as alumina.

Then, a second shield layer 8 for the reproducing head, comprising a magnetic material, is formed on the CPP-GMR device 5, bias magnetic field-applying layers 6 and insulating layer 7. The second shield layer 8, for instance, is formed by means of plating or sputtering.

Then, a separation layer 18 comprising an insulating material such as alumina is formed by sputtering or the like on the upper shield layer 8. Then, a lower magnetic pole layer 19, comprising a magnetic material and adapted for a recording head, is formed by plating, sputtering or the like on the separation layer 18. The magnetic material used for the second shield layer 8, and the lower magnetic pole layer 19, for instance, includes a soft magnetic material such as NiFe, CoFe, CoFeNi, and FeN. It is here noted that instead of the multilayer arrangement of the second shield layer 8, separation layer 18 and lower magnetic pole layer 19, it is acceptable to configure the second shield layer in such a way as to work also as a lower electrode layer.

Then, a recording gap layer 9 comprising a non-magnetic material such as alumina is formed by sputtering or the like on the lower magnetic pole layer 19. That recording gap layer has a thickness of about 50 to 300 nm.

For the formation of a magnetic path, the recording gap layer 9 is then partially etched at the center of the thin-film coil to be described later to form a contact hole 9a.

Then, a first layer portion 10 of the thin-film coil, typically comprising copper (Cu), is formed on the recording gap layer 9 at a thickness of typically 2 to 3 μm. In FIG. 2, note that reference numeral 10a stands for a connector portion of the first layer portion 10, which is to be connected to a second layer portion 15 of the thin-film coil to be described later. The first layer portion 10 is wound around the contact hole 9a.

Then, an insulating layer 11 comprising a photo-resist or other organic material having fluidity upon heating is formed in such a given pattern as to cover the first layer portion 10 of the thin-film coil and the surrounding recording gap layer 9.

Then, the insulating layer 11 is heat treated at a given temperature to make its surface flat. By this heat treatment, each of the edge portions of the outer and inner peripheries of the insulating layer 11 is configured into a rounded slant.

Then, in an area of the insulating layer 11 from a slant portion on the medium opposite plane 20 (to be described later) side to the medium opposite plane 20 side, a track width-setting layer 12a of an upper magnetic pole layer 12 is formed on the recording gap layer 9 and insulating layer 11, using the magnetic material for the recording head. The upper magnetic pole layer 12 is made of that track width-setting layer 12a, and a coupler portion layer 12b and a yoke portion layer 12c to be described later.

The track width-setting layer 12a is formed on the recording gap layer 9, including an end portion that provides a magnetic pole portion of the upper magnetic pole layer 12 and a connector portion that is formed on the slant portion of the insulating layer 11 on the medium opposite plane 20 side and connected to the yoke portion layer 12c. The width of that end portion is set equal to the recording track width, and the width of the connector portion is greater than the width of the end portion.

Simultaneously with the formation of the track width-setting layer 12a, the coupler portion 12b comprising a magnetic material is formed on the contact hole 9a and a connector layer 13 comprising a magnetic material is formed on the connector portion 10a. The coupler portion layer 12b forms a portion of the upper magnetic pole layer 12, which is to be magnetically connected to the upper shield layer 18.

Then, magnetic pole trimming is carried out. That is, in an area around the track width-setting layer 12a, the track width-setting layer 12a is used as a mask to etch at least a part of the recording gap layer 9 and the magnetic pole portion of the upper shield layer 8 on the recording gap layer 9 side, whereby, as shown in FIG. 3, there is a trim structure formed, in which at least a part of the magnetic pole portion of the upper magnetic pole layer 12, the recording gap layer 9 and the magnetic pole portion of the upper shield layer 8 has a uniform width. This trim structure makes sure prevention of an effective increase in the track width due to the spread of a magnetic flux near the recording gap layer 9.

Then, an insulating layer 14 comprising alumina or other inorganic insulating material is formed around the whole at a thickness of typically 3 to 4 μm.

Then, that insulating layer 14 is polished by chemo-mechanical polishing or the like as far as the surfaces of the track width-setting layer 12a, coupler portion layer 12b and connector layer 13 for flattening.

Then, the second layer portion 15 of the thin-film coil typically comprising copper (Cu) is formed on the flattened insulating layer 14 at a thickness of typically 2 to 3 μm. In FIG. 2, note that reference numeral 15a is indicative of a connector portion of the second layer portion 15, which is to be connected to the connector portion 10a of the first layer portion 10 of the thin-film coil by way of the connector layer 13. The second layer portion 15 is wound around the coupler portion layer 12b.

Then, an insulating layer 16 comprising a photo-resist or other organic material having fluidity upon heating is formed in such a given pattern as to cover the second layer portion 15 of the thin-film coil and the surrounding insulating layer 14.

Then, the insulating layer 16 is heat treated at a given temperature to make its surface flat. By this heat treatment, each of the edge portions of the outer and inner peripheries of the insulating layer 16 is configured into a rounded slant.

Then, the magnetic material for the recording head such as permalloy is used to form the yoke portion layer 12c forming the yoke portion of the upper magnetic layer 12 on the track width-setting layer 12a, insulating layers 14, 16 and coupler portion layer 12b. An end of the yoke layer portion 12c on the medium opposite plane 20 side is spaced away from the medium opposite plane 20, and the yoke portion layer 12c is connected to the lower magnetic pole layer 19 by way of the coupler portion layer 12b.

Then, an overcoat layer 17 typically comprising alumina is formed in such a way as to cover the whole. Finally, a slider including the aforesaid respective layers is machined to form the medium opposite plane 20 of the thin-film head including the recording head and reproducing head in the form of a complete thin-film magnetic head.

The thus fabricated thin-film magnetic head comprises the medium opposite plane 20 in opposition to the recording medium, the aforesaid reproducing head and the recording head (induction type of magnetic device).

The magnetic head comprises the magnetic lower and upper magnetic pole layers 19 and 12 that include mutually opposite magnetic pole portions on the medium opposite plane 20 side and are magnetically coupled to each other, the recording gap layer 9 located between the magnetic pole portion of the lower magnetic pole layer 19 and the magnetic pole portion of the upper magnetic pole layer 12, and the thin films 10, 15 at least a part of which is located between the lower 19 and the upper magnetic pole layer 12 while insulated from them.

As shown in FIG. 2, such a thin-film magnetic head has a throat height (indicated by TH in the drawing) that is defined by a length from the medium opposite plane 20 up to the end of the insulating layer 11 on the medium opposite plane side. In other words, the "throat height" means a length (height) from the medium opposite plane 20 to a position at which the two magnetic pole layers start being spaced away.

It is here noted that there is nothing specific about the type of the recording head; the invention may just as well be applied to a perpendicular magnetic recording head, for instance, a perpendicular magnetic recording head structure as set forth in JP(A)2006-155866.

(Explanation of How the Thin-Film Magnetic Head Works)

How the thin-film magnetic head according to the embodiment here works is now explained. The thin-film magnetic head records information in the recording medium by the recording head, and plays back the information recorded in the recording medium by the reproducing head.

At the reproducing head, the direction of a bias magnetic field applied by the bias magnetic field-applying layers 6 is orthogonal to a direction perpendicular to the medium opposite plane 20. At the CPP-GMR device 5 with no signal magnetic field applied yet, the magnetization direction of the free layer 50 lies in the direction of the bias magnetic field, and the magnetization direction of the fixed magnetization layer 30 is fixed in a direction perpendicular to the medium opposite plane 20.

At the CPP-GMR device 5, there is a change in the magnetization direction of the free layer 50 depending on a signal magnetic field from the recording medium, which in turn causes a change in the relative angle between the magnetization direction of the free layer 50 and the magnetization direction of the fixed magnetization layer 30, with the result that there is a change in the resistance value of the CPP-GMR device 5. The resistance value of the CPP-GMR device 5 may be found from a potential difference between the first and second shield layers, i.e., the two electrode layers 3 and 8 at the time when a sense current is passed through the MR device. It is thus possible for the reproducing head to play back the information recorded in the recording medium.

(Explanation of the Head Gimbal Assembly and the Magnetic Disk System)

The head gimbal assembly and the magnetic disk system according to the embodiment here are now explained.

A slider 210 included in the head gimbal assembly is first explained with reference to FIG. 4. In the magnetic disk system, the slider 210 is located in such a way as to face a hard disk that is a rotationally driven disk-form recording medium. This slider 210 primarily comprises a substrate 211 built up of a substrate 1 and an overcoat 17 depicted in FIG. 2.

The substrate 211 is in a generally hexahedral shape. Of the six surfaces of the substrate 211, one surface is in opposition to the hard disk. On that one surface there is a medium opposite plane 20 formed.

As the hard disk rotates in the z-direction in FIG. 4, it causes an air flow passing between the hard disk and the slider 210 to induce lift in the downward y-direction in FIG. 4. This lift in turn causes the slider 210 to levitate over the surface of the hard disk. Note here that the x-direction in FIG. 4 traverses tracks on the hard disk.

Near the end of the slider 210 on an air exit side (the left lower end in FIG. 4), there is the thin-film magnetic head 100 formed according to the invention.

A head gimbal assembly 220 according to this embodiment is now explained with reference to FIG. 5. The head gimbal assembly 220 comprises a slider 210 and a suspension 221 adapted to resiliently support that slider 210. The suspension 221 comprises a leaf spring-form load beam 222 formed typically of stainless steel, a flexure 223 attached to one end of the load beam 222 and having the slider 210 joined to it for giving a suitable degree of flexibility to the slider 210, and a base plate 224 attached to the other end of the load beam 222.

The base plate 224 is adapted to be attached to an arm 230 of an actuator for moving the slider 210 in the track traverse direction x of the hard disk 262. The actuator comprises the arm 230 and a voice coil motor for driving that arm 230. At a portion of the flexure 223 having the slider 210 attached to it, there is a gimbal portion provided for keeping the posture of the slider 210 constant.

The head gimbal assembly 220 is attached to the arm 230 of the actuator. The head gimbal assembly 220 attached to one arm 230 is called a head arm assembly, whereas the head gimbal assembly 220 attached to a carriage at its plurality of arms is referred to as a head stack assembly.

FIG. 5 illustrates one example of the head arm assembly, wherein the head gimbal assembly 220 is attached to one end of the arm 230. To the other end of the arm 230, a coil 231 forming a part of the voice coil motor is attached. Halfway across the arm 230, there is a bearing portion 233 attached to a shaft 234 adapted to support the arm 230 in a pivotal fashion.

One example of the head stack assembly and the magnetic disk system according to the instant embodiment are now explained with reference to FIGS. 6 and 7.

FIG. 6 is illustrative of part of the magnetic disk system, and FIG. 7 is a plan view of the magnetic disk system.

A head stack assembly 250 comprises a carriage 251 having a plurality of arms 252. The plurality of arms 252 are provided with a plurality of the head gimbal assemblies 220 such that they line up vertically at an interval. On the side of the carriage 251 that faces away from the arms 252, there is a coil 253 attached, which coil becomes a part of the voice coil motor. The head stack assembly 250 is incorporated in the magnetic disk system.

The magnetic disk system comprises a plurality of hard disks 262 attached to a spindle motor 261. For each hard disk 262, two sliders 210 are located such that they are opposite to each other with the hard disk 262 held between them. The voice coil motor has also permanent magnets 263 located at opposite positions with the coil 253 of the head stack assembly 250 held between them.

The head stack assembly 250 except the slider 210 and the actuator correspond to the positioning device here which is operable to support the slider 210 and position it relative to the hard disk 262.

With the magnetic disk system here, the actuator is actuated to move the slider 210 in the track traverse direction of the hard disk 262, thereby positioning the slider 210 with respect to the hard disk 262. The thin-film magnetic head incorporated in the slider 210 works such that information is recorded by a recording head in the hard disk 262, and the information recorded in the hard disk 262 is played back by a reproducing head.

The head gimbal assembly and the magnetic disk system here have pretty much the same action as the thin-film magnetic head according to the foregoing embodiment.

While the embodiment here has been described with reference to the thin-film magnetic head of the structure wherein the reproducing head is located on the substrate side and the recording head is stacked on the reproducing head, it is contemplated that that order of stacking could be reversed. When the thin-film magnetic head here is used as a read-only head, the recording head could be removed from it.

It is also contemplated that part of the invention may be applied not only to magnetic heads but also as a so-called thin-film magnetic field sensor adapted to detect a magnetic field.

Explanation of the Specific Experimental Examples

The CPP-GMR device as described above is now explained in more details with reference to the following specific experimental examples.

EXPERIMENTAL EXAMPLE I

An inventive CPP-GMR device sample having such a multilayer structure as shown in Table 1 and a reference comparative CPP-GMR device sample were formed by sputtering, and provided for ready. For the specific structures of the first and the second nonmagnetic metal layers as well as the semiconductor oxide layer, see Table 2 given later. For the bias magnetic field applying layers 6, CoPt was used.

TABLE 1

| Multilayer Structure | | Materials of the Layers | Thickness (nm) |
|---|---|---|---|
| Protective Layer | | Ru | 10.0 |
| Free Layer | | $Co_{70}Fe_{30}$ | 4.0 |
| Spacer Layer | 2$^{nd}$ Nonmagnetic Metal Layer | See Table 2 | T3 |
| | Semiconductor Oxide Layer | See Table 2 | T2 |

TABLE 1-continued

| Multilayer Structure | | Materials of the Layers | Thickness (nm) |
|---|---|---|---|
| | 1st Nonmagnetic Metal Layer | See Table 2 | T1 |
| Fixed Magnetization Layer | Inner Layer | Co$_{65}$Fe$_{35}$ | 3.5 |
| | Nonmagnetic Intermediate Layer | Ru | 0.8 |
| | Outer Layer | Co$_{70}$Fe$_{30}$ | 3.0 |
| Antiferromagnetic Layer | | IrMn | 5.0 |
| Underlay Layer | | Ru | 2.0 |
| | | Ta | 1.0 |

In actual sample preparation, the composition and thickness of the semiconductor oxide layer forming a part of the spacer layer in Table 1 as well as the composition and thickness of the first and the second nonmagnetic metal layer were varied, thereby preparing various such samples as shown in Table 2.

In Reference Example I-1 in Table 2, the composition of the second nonmagnetic metal layer forming a part of the spacer layer in Table 1 is made of Cu.

For sample preparation, the respective layers forming the CPP-GMR device were formed into films in order, thereby making a multilayer sample, which was then heat treated at 270° C. for 3 hours primarily for the purpose of crystallizing the semiconductor oxide layer to make its resistance low, and placing the direction of magnetization of the pined layer in order. Experimentation has taught that this heat treatment should preferably be done in the range of 200 to 350° C.

Semiconductor oxide layers ((ZnO), (SnO$_2$), (In$_2$O$_3$), and (ITO: In$_2$O$_3$+SnO$_2$)), each forming a part of the spacer layer, were formed as follows.

(i) Semiconductor Oxide Layer Composed of ZnO

A ZnO target was used to form a semiconductor oxide or ZnO layer into a film by sputtering.

The respective layers forming the device were formed into films, which were then heat treated at 270° C. for 3 hours to crystallize the ZnO layer, thereby making its resistance low.

Such a multilayer film providing a fundamental device portion was processed into a columnar shape, and its sides were protected by an insulator to prepare a CPP-GMR device.

(ii) Semiconductor Oxide Layer Made of SnO$_2$

A SnO$_2$ target was used to form a semiconductor oxide layer into a film by sputtering.

After formed into films, the respective layers forming the device were heat treated at 270° C. for three hours to crystallize the SnO$_2$ layer for the purpose of making its resistance low.

Such a multilayer film providing a fundamental device portion was processed into a columnar shape, and its sides were protected by an insulator to prepare a CPP-GMR device.

(iii) Semiconductor Oxide Layer Composed of In$_2$O$_3$

An In$_2$O$_3$ target was used to form a semiconductor oxide layer into a film by sputtering.

After formed into films, the respective layers forming the device were heat treated at 270° C. for three hours to crystallize the In$_2$O$_3$ layer for the purpose of making its resistance low.

Such a multilayer film providing a fundamental device portion was processed into a columnar shape, and its sides were protected by an insulator to prepare a CPP-GMR device.

(iv) Semiconductor Oxide Layer Composed of (ITO: In$_2$O$_3$+SnO$_2$)

A given amount of SnO$_2$ was mixed with In$_2$O$_3$, and the mixture was fired into a target, which was then used to form the semiconductor oxide layer into a film by sputtering. In the state of that addition shown in FIG. 3, 5 mol % of SnO$_2$ were going to be contained in the formed film.

After formed into films, the respective layers forming the device were heat treated at 270° C. for three hours to crystallize the (In$_2$O$_3$+SnO$_2$) layer for the purpose of making its resistance low.

Such a multilayer film providing a fundamental device portion was processed into a columnar shape, and its sides were protected by an insulator to prepare a CPP-GMR device.

As each CPP-GMR device prepared according to the aforesaid procedure was viewed from above, it took on a rectangular shape having a width (length in the track width direction) of 0.06 μm. and a length of 0.10 μm (in a direction (MR height direction) perpendicular to a depth direction relative to the ABS). This shape is much the same as that of a GMR device actually applied to a reproducing head. Irrespective of device shape, the results of experimentation have indicated substantially similar tendencies.

Each of these CPP-GMR devices was measured and estimated according to the following procedures about (1) MR ratio, and (2) the area resistivity of the device, AR, (Ω·μm$^2$).

(1) MR Ratio

The MR ratio was measured by an ordinary dc four-terminal method. The MR ratio is represented by ΔR/R where ΔR is indicative of the amount of resistance change, and R is indicative of a resistance value. The figure, because of being small, is indicated in terms of percentage.

Note here that the MR ratio was found as an average of 100 samples.

(2) Area Resistivity, ΔR (Ω·μm$^2$), of the Device

The area resistivity was measured by a dc four-terminal method.

The results are shown in Table 2.

TABLE 2

| | Spacer Layer | | | | | | Device | |
|---|---|---|---|---|---|---|---|---|
| | 1st Nonmagnetic Metal Layer | | Semiconductor Oxide Layer | | 2nd Nonmagnetic Metal Layer | | | |
| Sample No. | Material | Thickness T1 (nm) | Material | Thickness T2 (nm) | Material | Thickness T3 (nm) | MR Ratio (%) | Area Resistivity (Ω·μm$^2$) |
| Ref. Ex. I-1 | Cu | 0.7 | ZnO | 1.7 | Cu | 0.7 | 14.5 | 0.22 |
| Comp. Ex. I-1 | Cu | 0.7 | ZnO | 1.7 | — | — | 12.5 | 0.14 |

TABLE 2-continued

| | Spacer Layer | | | | | | | |
|---|---|---|---|---|---|---|---|---|
| | 1st Nonmagnetic Metal Layer | | Semiconductor Oxide Layer | | 2nd Nonmagnetic Metal Layer | | Device | |
| Sample No. | Material | Thickness T1 (nm) | Material | Thickness T2 (nm) | Material | Thickness T3 (nm) | MR Ratio (%) | Area Resistivity ($\Omega \cdot \mu m^2$) |
| Ex. I-1 | Cu | 0.7 | ZnO | 1.7 | Zn | 0.1 | 17.8 | 0.14 |
| Ex. I-2 | Cu | 0.7 | ZnO | 1.7 | Zn | 0.4 | 18.8 | 0.15 |
| Ex. I-3 | Cu | 0.7 | ZnO | 1.7 | Zn | 0.7 | 16.3 | 0.22 |
| Ex. I-4 | Cu | 0.7 | ZnO | 1.7 | Zn | 1.2 | 14.9 | 0.23 |
| Ex. I-5 | Cu | 0.7 | ZnO | 1.7 | GaO/Zn | (0.5/ 0.2) | 19.0 | 0.15 |
| Ex. I-6 | Cu | 0.7 | ITO | 1.8 | Zn | 0.1 | 15.1 | 0.17 |
| Ex. I-7 | Cu | 0.7 | ITO | 1.8 | Zn | 0.4 | 15.5 | 0.18 |
| Ex. I-8 | Cu | 0.7 | ITO | 1.8 | Zn | 0.7 | 14.9 | 0.21 |
| Ex. I-9 | Cu | 0.7 | ITO | 1.8 | Zn | 1.2 | 14.6 | 0.23 |
| Ex. I-10 | Cu | 0.7 | $SnO_2$ | 1.8 | Zn | 0.1 | 14.8 | 0.13 |
| Ex. I-11 | Cu | 0.7 | $SnO_2$ | 1.8 | Zn | 0.4 | 15.2 | 0.13 |
| Ex. I-12 | Cu | 0.7 | $SnO_2$ | 1.8 | Zn | 0.7 | 15.0 | 0.19 |
| Ex. I-13 | Cu | 0.7 | $SnO_2$ | 1.8 | Zn | 1.2 | 14.7 | 0.21 |
| Ex. I-14 | Cu | 0.7 | $In_2O_3$ | 1.8 | Zn | 0.1 | 14.6 | 0.14 |
| Ex. I-15 | Cu | 0.7 | $In_2O_3$ | 1.8 | Zn | 0.4 | 15.1 | 0.15 |
| Ex. I-16 | Cu | 0.7 | $In_2O_3$ | 1.8 | Zn | 0.7 | 14.9 | 0.20 |
| Ex. I-17 | Cu | 0.7 | $In_2O_3$ | 1.8 | Zn | 1.2 | 14.6 | 0.22 |
| Ex. I-18 | Cu | 0.1 | ZnO | 1.7 | Zn | 0.7 | 15.5 | 0.20 |
| Ex. I-19 | Cu | 0.4 | ZnO | 1.7 | Zn | 0.7 | 16.5 | 0.21 |
| Ex. I-20 | Cu | 1.2 | ZnO | 1.7 | Zn | 0.7 | 15.8 | 0.24 |
| Ex. I-21 | Zn | 0.1 | ZnO | 1.7 | Cu | 0.7 | 15.3 | 0.18 |
| Ex. I-22 | Zn | 0.4 | ZnO | 1.7 | Cu | 0.7 | 16.2 | 0.20 |
| Ex. I-23 | Zn | 0.7 | ZnO | 1.7 | Cu | 0.7 | 15.8 | 0.23 |
| Ex. I-24 | Zn | 1.2 | ZnO | 1.7 | Cu | 0.7 | 14.8 | 0.24 |
| Ex. I-25 | Zn | 0.7 | ITO | 1.8 | Cu | 0.7 | 14.8 | 0.22 |
| Ex. I-26 | Zn | 0.7 | $SnO_2$ | 1.8 | Cu | 0.7 | 14.7 | 0.21 |
| Ex. I-27 | Zn | 0.7 | $In_2O_3$ | 1.8 | Cu | 0.7 | 14.7 | 0.21 |
| Ex. I-28 | Cu | 0.7 | ZnO | 1.7 | Zn—Ga Alloy | 0.7 | 17.5 | 0.17 |

The advantages of the invention would be evidently appreciated from the results of Table 2. That is, it is appreciated that by designing the construction of the spacer layer according to the invention, there is a further improvement in the MR change ratio. The device area resistivity AR ($\Omega \cdot \mu m^2$), too, comes under the preferable numerical range.

EXPERIMENTAL EXAMPLE II

Using such CPP-GMR device samples as selected out of Table 2 and shown in Table 3 given below, heat resistance experimentation was done. That is, after the formation of the devices, they were again heat treated (annealed) at 270° C. for 3 hours, thereby confirming how the device characteristics changed. What was measured was the aforesaid MR ratio and device area resistivity AR.

The results are summed up in Table 3 given just below

TABLE 3

| | Spacer Layer | | | | | | Initial | | After 207 deg C. Anneal | |
|---|---|---|---|---|---|---|---|---|---|---|
| | 1st Nonmagnetic Metal Layer | | Semiconductor Oxide Layer | | 2nd Nonmagnetic Metal Layer | | MR | | MR | |
| Sample No. | Material | T1 (nm) | Material | T2 (nm) | Material | T3 (nm) | Ratio (%) | AR ($\Omega \cdot \mu m^2$) | Ratio (%) | AR ($\Omega \cdot \mu m^2$) |
| Ref. Ex. II-1 (I-1) | Cu | 0.7 | ZnO | 1.7 | Cu | 0.7 | 14.5 | 0.22 | 13.5 | 0.19 |
| Ex. II-1 (I-2) | Cu | 0.7 | ZnO | 1.7 | Zn | 0.4 | 18.8 | 0.15 | 18.8 | 0.15 |
| Ex. II-2 (I-3) | Cu | 0.7 | ZnO | 1.7 | Zn | 0.7 | 16.3 | 0.22 | 16.4 | 0.21 |

TABLE 3-continued

| | Spacer Layer | | | | | | Initial | | After 207 deg C. Anneal | |
| | 1st Nonmagnetic Metal Layer | | Semiconductor Oxide Layer | | 2nd Nonmagnetic Metal Layer | | | | | |
| Sample No. | Material | T1 (nm) | Material | T2 (nm) | Material | T3 (nm) | MR Ratio (%) | AR (Ω·μm²) | MR Ratio (%) | AR (Ω·μm²) |
| --- | --- | --- | --- | --- | --- | --- | --- | --- | --- | --- |
| Ex. II-3 (I-7) | Cu | 0.7 | ITO | 1.8 | Zn | 0.4 | 15.5 | 0.18 | 15.5 | 0.18 |
| Ex. II-4 (1-11) | Cu | 0.7 | SnO₂ | 1.8 | Zn | 0.4 | 15.2 | 0.13 | 15.3 | 0.13 |
| Ex. II-5 (1-15) | Cu | 0.7 | In₂O₃ | 1.8 | Zn | 0.4 | 15.1 | 0.15 | 15.0 | 0.15 |

From the results of experimentation set out in Table 3, the advantages of the invention would be evident. That is, it is seen that by designing the construction of the spacer layer according to the invention, there is a substantial reduction in the device characteristics fluctuations due to annealing added after device formation. Although details of why this mechanism works have yet to be clarified, the parameter for oxygen migration would appear to contribute to it in some unknown form.

From the aforesaid results of the experiments, the advantages of the invention would be evident. That is, the present invention provides a giant magneto-resistive effect device (CPP-GMR device) having a CPP (current perpendicular to plane) structure comprising a spacer layer, and a fixed magnetization layer and a free layer stacked one upon another with said spacer layer interposed between them, with a sense current applied in a stacking direction, wherein said free layer functions such that a magnetization direction changes depending on an external magnetic field, and said spacer layer comprises a first nonmagnetic metal layer and a second nonmagnetic metal layer, each formed of a nonmagnetic metal material, and a semiconductor oxide layer interposed between the first nonmagnetic metal layer and the second nonmagnetic metal layer, wherein the semiconductor oxide layer that forms a part of said spacer layer is made of at least one selected from the group consisting of zinc oxide, tin oxide, indium oxide, and indium tin oxide (ITO), said first non-magnetic metal layer is made of Cu, and said second nonmagnetic metal layer is substantially made of Zn. There is thus a substantial improvement in the MR change ratio. In addition, there is heat resistance improved with reductions in device characteristics fluctuations due to annealing added after device formation.

Referring to possible applications of the invention to the industry, it could be utilized in the industry of magnetic disk systems comprising a magneto-resistive effect device for reading the magnetic fields of magnetic recording media or the like as signals.

What we claim is:

1. A magneto-resistive effect device having a CPP (current perpendicular to plane) structure comprising a spacer layer, and two magnetic layers stacked one upon another with said spacer layer interposed between them, with a sense current applied in a stacking direction, characterized in that:
   said spacer layer comprises a first nonmagnetic metal layer and a second nonmagnetic metal layer, each formed of a nonmagnetic metal material, and a semiconductor oxide layer interposed between the first nonmagnetic metal layer and the second nonmagnetic metal layer, wherein:
   the semiconductor oxide layer that forms a part of said spacer layer is made of at least one selected from the group consisting of zinc oxide, tin oxide, indium oxide, and indium tin oxide (ITO),
   said first non-magnetic metal layer is made of Cu, and
   said second nonmagnetic metal layer is substantially made of Zn.

2. The magneto-resistive effect device (CPP-GMR device) having a CPP (current perpendicular to plane) structure according to claim 1, wherein said two magnetic layers are a fixed magnetization layer and a free layer, with a sensing current applied in a stacking direction thereof, and wherein said free layer functions such that a magnetization direction changes depending on an external magnetic field.

3. The magneto-resistive effect device according to claim 2, wherein said spacer layer is located such that said first nonmagnetic metal layer is in contact with said fixed magnetization layer, and said second nonmagnetic metal layer is in contact with said free layer.

4. The magneto-resistive effect device according to claim 2, wherein said spacer layer is located such that said first nonmagnetic metal layer is in contact with said free layer, and said second nonmagnetic metal layer is in contact with said fixed magnetization layer.

5. The magneto-resistive effect device according to claim 1, wherein said first nonmagnetic metal layer has a thickness of 0.1 to 1.2 nm, said second nonmagnetic layer has a thickness of 0.1 to 1.2 nm, and said semiconductor oxide layer forming a part of said spacer layer has a thickness of 1.0 to 4.0 nm.

6. The magneto-resistive effect device according to claim 1, wherein said second nonmagnetic metal layer is made of a single layer of Zn, an alloy layer of Zn and Ga, or a multilayer of Zn and GaO.

7. The magneto-resistive effect device according to claim 1, which has an area resistivity of 0.1 to 0.3 Ω·μm².

8. The magneto-resistive effect device according to claim 1, wherein said spacer layer has an electro-conductivity of 133 to 432 (S/cm).

9. A thin-film magnetic head, characterized by comprising:
a plane opposite to a recoding medium,
a magneto-resistive effect device as recited in claim 1, which is located near said medium opposite plane for detecting a signal magnetic field from said recording medium, and
a pair of electrodes for passing a current in the stacking direction of said magneto-resistive effect device.

10. A head gimbal assembly, characterized by comprising:
a slider including a thin-film magnetic head as recited in claim 9 and located in opposition to a recording medium, and
a suspension adapted to resiliently support said slider.

11. A magnetic disk system, characterized by comprising:
a slider including a thin-film magnetic head as recited in claim 9 and located in opposition to a recording medium, and
a positioning means adapted to support and position said slider with respect to said recording medium.

* * * * *